(12) United States Patent
Wei et al.

(10) Patent No.: US 8,569,081 B2
(45) Date of Patent: Oct. 29, 2013

(54) METHOD OF MAKING LIGHT EMITTING DIODE

(71) Applicants: Tsinghua University, Beijing (CN); Hon Hai Precision Industry Co., Ltd., New Taipei (TW)

(72) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/859,039

(22) Filed: Apr. 9, 2013

(65) Prior Publication Data
US 2013/0224893 A1    Aug. 29, 2013

Related U.S. Application Data

(63) Continuation of application No. 13/288,183, filed on Nov. 3, 2011, now Pat. No. 8,440,485.

(30) Foreign Application Priority Data

Apr. 29, 2011 (CN) .......................... 2011 1 0110765

(51) Int. Cl.
*H01L 21/00* (2006.01)

(52) U.S. Cl.
USPC .................. 438/22; 438/24; 438/30; 438/48; 438/E21.592; 257/98; 257/99; 977/42; 977/842

(58) Field of Classification Search
USPC ........ 257/76–77, 43, 618; 438/22, 24, 30, 42, 438/46, 47, 48, E33.012; 977/42, 842
See application file for complete search history.

(56) References Cited

U.S. PATENT DOCUMENTS

2010/0133569 A1*  6/2010  Li et al. ........................ 257/98

\* cited by examiner

*Primary Examiner* — Dung A. Le
(74) *Attorney, Agent, or Firm* — Altis & Wispro Law Group, Inc.

(57) ABSTRACT

A method of making a LED includes following steps. A substrate is provided, and the substrate includes an epitaxial growth surface. A buffer layer is grown on the epitaxial growth surface. A carbon nanotube layer is placed on the buffer layer. A first semiconductor layer, an active layer, and a second semiconductor layer are grown in that order on the buffer layer. A reflector and a first electrode are deposited on the second semiconductor layer in that order. The substrate and the buffer layer are removed. A second electrode is deposited on the first semiconductor layer.

15 Claims, 11 Drawing Sheets

METHOD OF MAKING LIGHT EMITTING DIODE

CROSS-REFERENCE TO RELATED APPLICATIONS

This application is a continuation of U.S. patent application Ser. No. 13/288,183, filed on Nov. 3, 2011, entitled, "METHOD FOR MAKING LIGHT EMITTING DIODE," which claims all benefits accruing under 35 U.S.C. §119 from China Patent Application No. 201110110765.7, filed on Apr. 29, 2011 in the China Intellectual Property Office. The disclosures of the above-identified applications are incorporated herein by reference.

BACKGROUND

1. Technical Field

The present disclosure relates to a light emitting diode (LED) and a method for making the same.

2. Description of the Related Art

LEDs are semiconductors that convert electrical energy into light. Compared to conventional light sources, LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional method of making the LEDs method includes the following steps. A buffer layer, a first semiconductor layer, an active layer and a second semiconductor layer are deposited on a substrate by a metal organic chemical vapor deposition method. The second semiconductor layer and the active layer are etched via inductance-coupling plasma etch process, thereby exposing a surface of the first semiconductor layer. A first electrode is deposited on a top surface of the first semiconductor layer via electron beam evaporation process. A second electrode is formed on the second semiconductor layer via electron beam evaporation process. In order to improve the light extraction efficiency of the LEDs, the second semiconductor is etched via inductance-coupling plasma etch process to roughen a top surface. The roughened top surface is used as the light extraction surface. However, in the above method, etching the light extraction surface to roughen the top surface thereof is a complex manufacturing process and has a high manufacturing cost. Furthermore, during the etch process, the lattice structure of the semiconductor layer may be destroyed.

What is needed, therefore, is a method for making a light emitting diode, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
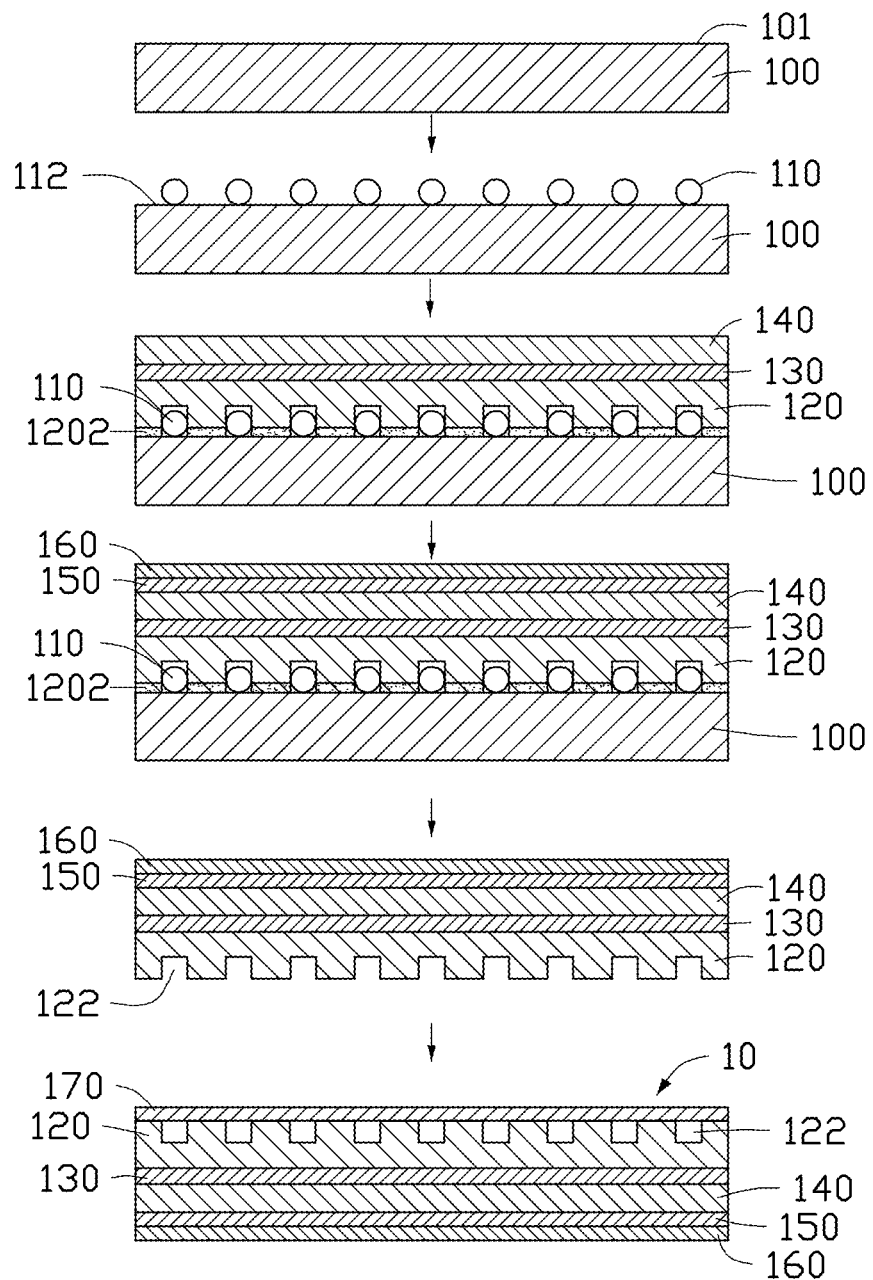
FIG. 1 is a flowchart of one embodiment a method for manufacturing a LED.

Referring to FIG. 1, a method for manufacturing an light emitting diode (LED) 10 includes the following steps:

(S11) providing a substrate 100 having an epitaxial growth surface 101;
(S12) placing a carbon nanotube layer 110 on the epitaxial growth surface 101;
(S13) growing a first semiconductor layer 120, an active layer 130, a second semiconductor layer 140 in that order on the epitaxial growth surface 101;
(S14) placing a reflector 150 and a first electrode 160 in that order on a surface of the second semiconductor layer 140;
(S15) removing the substrate 100 to expose a surface of the first semiconductor layer 120 as a light extraction surface of the LED 10; and
(S16) applying a second electrode 170 on a surface of the first semiconductor layer 120.

In step (S11), the substrate 100 can be made of a transparent material and adapted to support the first semiconductor layer 120. A shape or a size of the substrate 100 is selected according to need. The epitaxial growth surface 101 can be used to grow the first semiconductor layer 120. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AN, Si, SOL SiC, MgO, ZnO, LiGaO2, LiAlO2, or Al2O3. The material of the substrate 100 can be selected according to the material of the first semiconductor layer 120. The first semiconductor layer 120 and the substrate 100 should have a small crystal lattice mismatch and a thermal expansion mismatch. The size, thickness, and shape of the substrate 100 can be selected according to need. In one embodiment, the substrate 100 is a sapphire substrate.

In step (S12), the first carbon nanotube layer 110 includes a plurality of carbon nanotubes. The carbon nanotubes in the first carbon nanotube layer 110 can be single-walled, double-walled, or multi-walled carbon nanotubes. The length and diameter of the carbon nanotubes can be selected according to need. The thickness of the first carbon nanotube layer 110 can be in a range from about 1 nm to about 100 μm, for example, about 10 nm, 100 nm, 200 nm, 1 μm, 10 μm, or 50 μm. The first carbon nanotube layer 110 forms a pattern so part of the epitaxial growth surface 101 can be exposed from the patterned first carbon nanotube layer 110 after the first carbon nanotube layer 110 is placed on the epitaxial growth surface 101. Thus, the first semiconductor layer 120 can grow from the exposed epitaxial growth surface 101.

The patterned first carbon nanotube layer 110 defines a plurality of first apertures 112. The first apertures 112 can be dispersed uniformly. The apertures 112 extend throughout the first carbon nanotube layer 110 along the thickness direction thereof. The apertures 112 can be a hole defined by several adjacent carbon nanotubes, or a gap defined by two substantially parallel carbon nanotubes and extending along axial direction of the carbon nanotubes. If the aperture 112 is a hole, the average diameter of the apertures 112 can be in a range from about 10 nm to about 500 μm. If the aperture 112 is a gap, the average width of the apertures 112 can be in a range from about 10 nm to about 500 μm. The hole-shaped apertures 112 and the gap-shaped apertures 112 can exist in the patterned first carbon nanotube layer 110 at the same time. Hereafter, the size of the apertures 112 can be the diameter of the hole or width of the gap. The sizes of the first apertures 112 can be different. The sizes of the first apertures 112 can be in a range from about 10 nm to about 300 μm, for example, about 50 nm, 100 nm, 500 nm, 1 μm, 10 μm, 80 μm or 120 μm. The smaller the sizes of the first apertures 112, the less dislocation defects will occur during the process of growing first semiconductor layer 120. In one embodiment, the sizes of the first apertures 112 are in a range from about 10 nm to about 10 μm. The duty factor of the first carbon nanotube layer 110 means an area ratio between the sheltered epitaxial growth surface 101 and the exposed epitaxial growth surface 101. The duty factor of the first carbon nanotube layer 110 can be in a range from about 1:100 to about 100:1, for example, about 1:10, 1:2, 1:4, 4:1, 2:1 or 10:1. In one embodiment, the duty factor of the first carbon nanotube layer 110 is in a range from about 1:4 to about 4:1.

The carbon nanotubes of the first carbon nanotube layer 110 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be almost the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the first carbon nanotube layer 110 are arranged to extend along the direction substantially parallel to the surface of the first carbon nanotube layer 110 to obtain a better pattern and greater light transmission. After being placed on the epitaxial growth surface 101, the carbon nanotubes in the first carbon nanotube layer 110 are arranged to extend along the direction substantially parallel to the epitaxial growth surface 101. In one embodiment, all the carbon nanotubes in the first carbon nanotube layer 110 are arranged to extend along the same direction. In another embodiment, some of the carbon nanotubes in the first carbon nanotube layer 110 are arranged to extend along a first direction, and some of the carbon nanotubes in the first carbon nanotube layer 110 are arranged to extend along a second direction, substantially perpendicular to the first direction. The carbon nanotubes in the ordered carbon nanotube structure can also be arranged to extend along the crystal orientation of the substrate 100 or along a direction which forms an angle with the crystal orientation of the substrate 100.

The first carbon nanotube layer 110 can be formed on the epitaxial growth surface 101 by chemical vapor deposition (CVD), transfer printing a preformed carbon nanotube film, filtering and depositing a carbon nanotube suspension. However, all of the above described methods need an assistant support. In one embodiment, the first carbon nanotube layer 110 is a free-standing structure and can be drawn from a carbon nanotube array. The term "free-standing structure" means that the first carbon nanotube layer 110 can sustain the weight of itself when it is hoisted by a portion thereof without any significant damage to its structural integrity. Thus, the first carbon nanotube layer 110 can be suspended by two spaced supports. The free-standing first carbon nanotube layer 110 can be laid on the epitaxial growth surface 101 directly and easily.

The first carbon nanotube layer 110 can be a substantially pure structure of the carbon nanotubes, with few impurities and chemical functional groups. The first carbon nanotube layer 110 can be a composite including a carbon nanotube matrix and non-carbon nanotube materials. The non-carbon nanotube materials can be graphite, graphene, silicon carbide, boron nitride, silicon nitride, silicon dioxide, diamond, or amorphous carbon, metal carbides, metal oxides, or metal nitrides. The non-carbon nanotube materials can be coated on the carbon nanotubes of the first carbon nanotube layer 110 or filled in the apertures 112. In one embodiment, the non-carbon nanotube materials are coated on the carbon nanotubes of the first carbon nanotube layer 110 so the carbon nanotubes have a greater diameter and the first apertures 112 can have a smaller size. The non-carbon nanotube materials can be deposited on the carbon nanotubes of the first carbon nanotube layer 110 by CVD or physical vapor deposition (PVD), such as sputtering.

Furthermore, the first carbon nanotube layer 110 can be treated with an organic solvent after being placed on the epitaxial growth surface 101 so the first carbon nanotube layer 110 can be attached on the epitaxial growth surface 101 firmly. Specifically, the organic solvent can be applied to the entire surface of the first carbon nanotube layer 110 or the entire first carbon nanotube layer 110 can be immerged in an organic solvent. The organic solvent can be volatile, such as ethanol, methanol, acetone, dichloroethane, chloroform, or mixtures thereof. In one embodiment, the organic solvent is ethanol.

The first carbon nanotube layer 110 can include at least one carbon nanotube film, at least one carbon nanotube wire, or a combination thereof. In one embodiment, the first carbon nanotube layer 110 can include a single carbon nanotube film or two or more stacked carbon nanotube films. Thus, the thickness of the first carbon nanotube layer 110 can be controlled by controlling the number of the stacked carbon nanotube films. The number of the stacked carbon nanotube films can be in a range from about 2 to about 100, for example, about 10, 30, or 50. In one embodiment, the first carbon nanotube layer 110 can include a layer of parallel and spaced carbon nanotube wires. Also, the first carbon nanotube layer 110 can include a plurality of carbon nanotube wires crossed, or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The gap between two adjacent substantially parallel carbon nanotube wires is defined as the apertures 112. The size of the apertures 112 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 2:
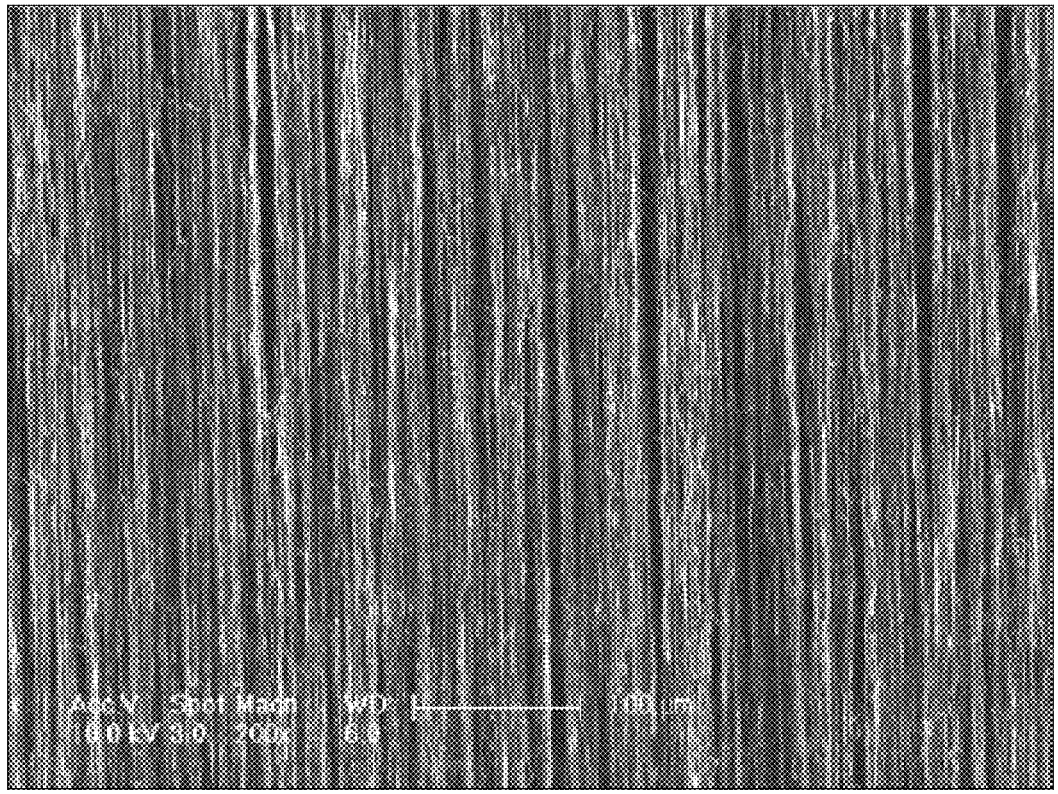
FIG. 2 shows a scanning electron microscope (SEM) image of one embodiment of a drawn carbon nanotube film.
Figure 3:
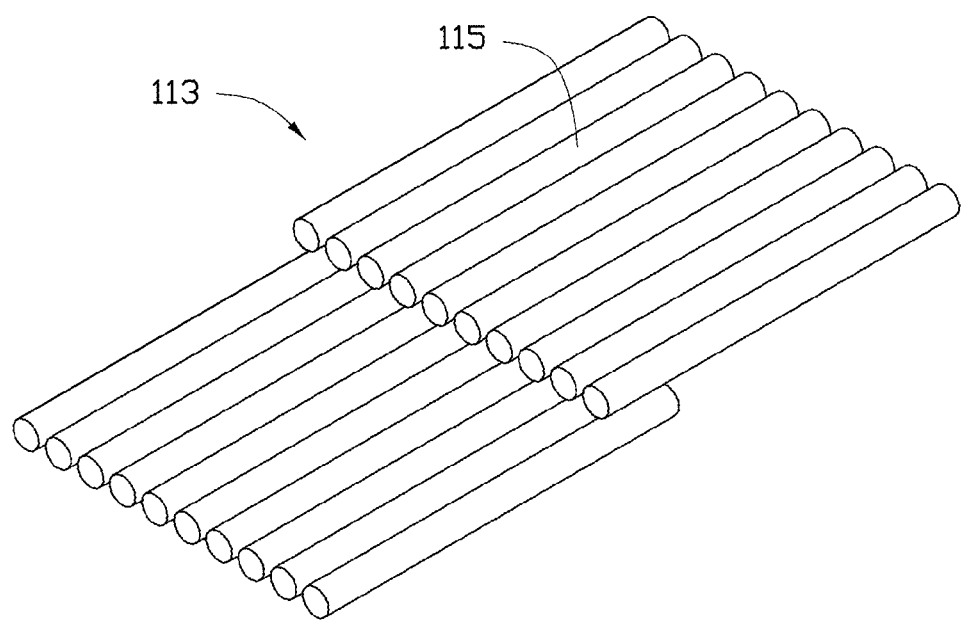
FIG. 3 shows a schematic view of one embodiment of a carbon nanotube segment of a drawn carbon nanotube film.

In one embodiment, the first carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 2 to 3, each drawn carbon nanotube film includes a plurality of successively oriented carbon nanotube segments 113 joined end-to-end by van der Waals attractive force therebetween. Each carbon nanotube segment 113 includes a plurality of carbon nanotubes 115 parallel to each other, and combined by van der Waals attractive force therebetween. Some variations can occur in the drawn carbon nanotube film. The carbon nanotubes 115 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nm to about 100 μm. The drawn carbon nanotube film can be attached to the epitaxial growth surface 101 directly.

Figure 4:
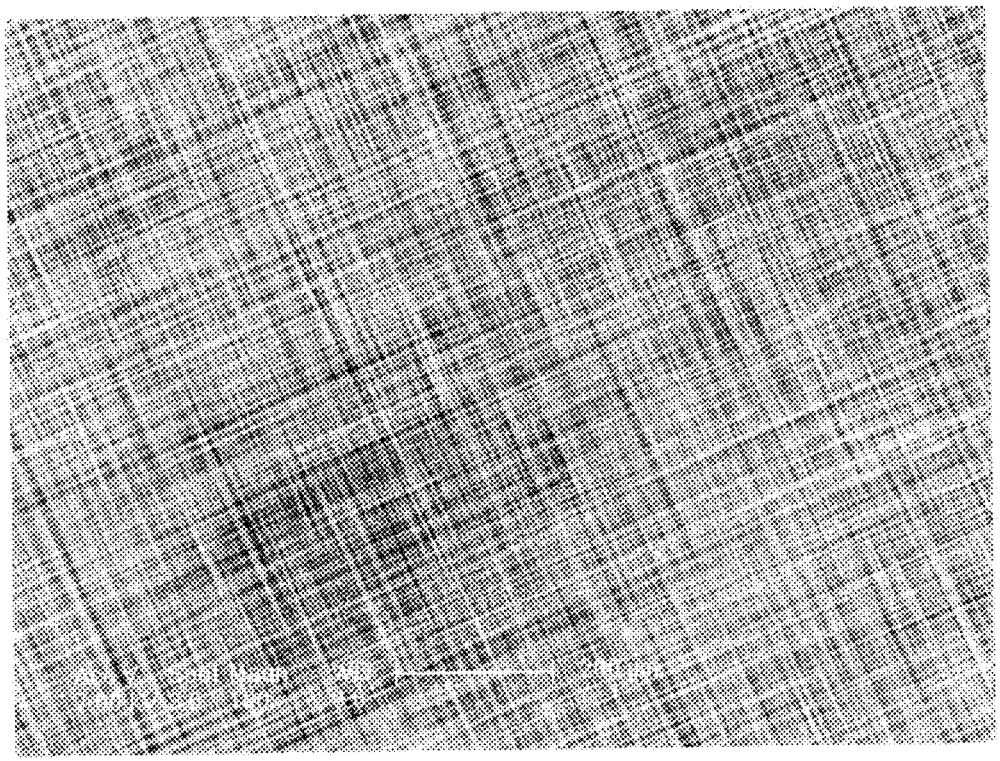
FIG. 4 shows a SEM image of one embodiment of a plurality of carbon nanotube film are stacked in a cross order.

Referring to FIG. 4, the first carbon nanotube layer 110 can include at least two stacked drawn carbon nanotube films. In other embodiments, the first carbon nanotube layer 110 can include two or more coplanar carbon nanotube films, and can include layers of coplanar carbon nanotube films. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the first carbon nanotube layer 110. Referring to FIG. 4, the first carbon nanotube layer 110 is shown with the angle between the aligned directions of the carbon nanotubes in adjacent stacked drawn carbon nanotube films is 90 degrees. Stacking the carbon nanotube films will also add to the structural integrity of the first carbon nanotube layer 110.

A step of heating the drawn carbon nanotube film can be performed to decrease the thickness of the drawn carbon nanotube film. The drawn carbon nanotube film can be partially heated by a laser or microwaves. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ W/m$^2$. The drawn carbon nanotube film can be heated by fixing the drawn carbon nanotube film and moving the laser device at an even/uniform speed to irradiate the drawn carbon nanotube film. When the laser irradiates the drawn carbon nanotube film, the laser is focused on the surface of drawn carbon nanotube film to form a laser spot. The diameter of the laser spot ranges from about 1 micron to about 5 mm. In one embodiment, the laser device is carbon dioxide laser device. The power of the laser device is 30 W. The wavelength of the laser is 10.6 μm. The diameter of the laser spot is 3 mm. The velocity of the laser movement is less than 10 mm/s. The power density of the laser is $0.053 \times 10^{12}$ W/m$^2$.

In another embodiment, the first carbon nanotube layer 110 can include a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is 0 degrees to approximately 15 degrees. The greater the pressure applied, the smaller the angle formed. If the carbon nanotubes in the pressed carbon nanotube film are arranged along different directions, the first carbon nanotube layer 110 can be isotropic.

In another embodiment, the first carbon nanotube layer 110 includes a flocculated carbon nanotube film. The flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. It is understood that the flocculated carbon nanotube film is very porous. Sizes of the micropores can be less than 10 μm. The porous nature of the flocculated carbon nanotube film will increase specific surface area of the first carbon nanotube layer 110. Further, because the carbon nanotubes in the first carbon nanotube layer 110 are entangled with each other, the first carbon nanotube layer 110 employing the flocculated carbon nanotube film has excellent durability, and can be fashioned into desired shapes with a low risk to the integrity of the first carbon nanotube layer 110. The flocculated carbon nanotube film, in some embodiments, is free standing because the carbon nanotubes being entangled and adhered together by van der Waals attractive force therebetween.

Figure 5:
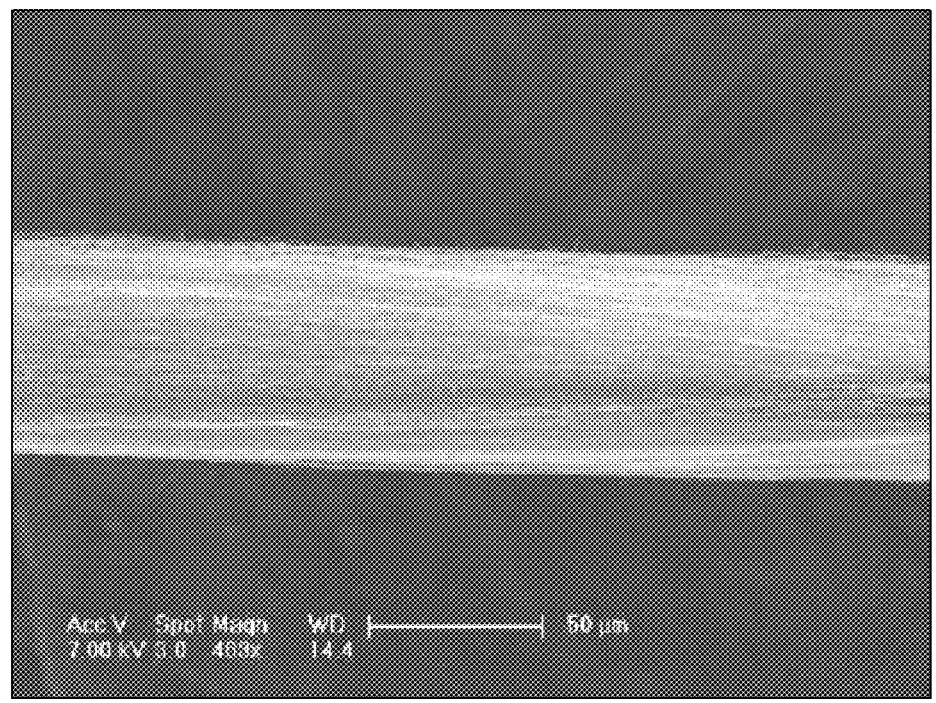
FIG. 5 shows a SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into untwisted carbon nanotube wire. Referring to FIG. 5, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nm to about 100 μm.

Figure 6:
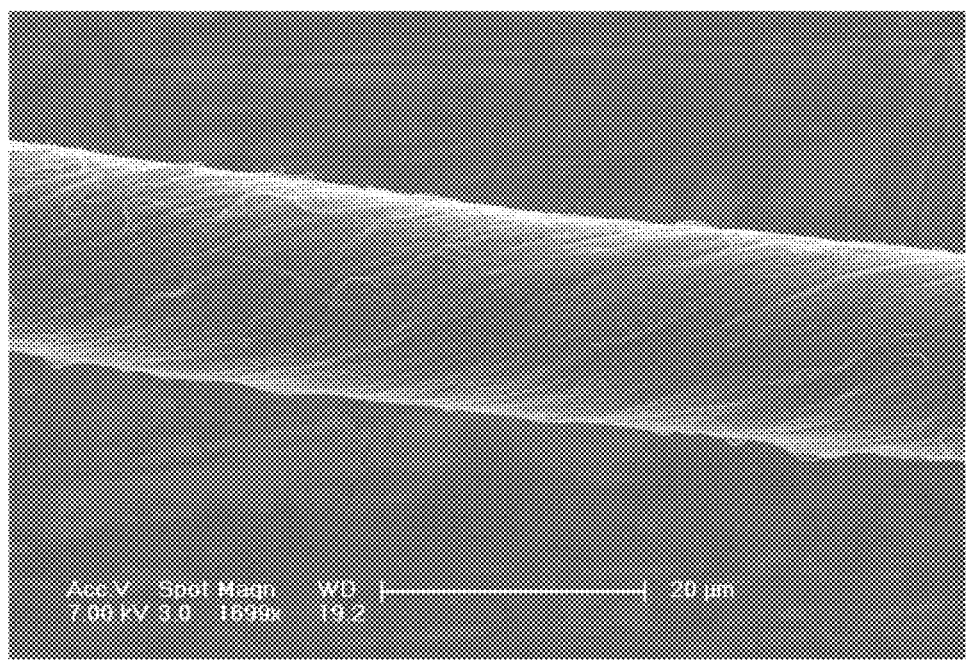
FIG. 6 shows a SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 6, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

As discussed above, the first carbon nanotube layer 110 can be used as a mask for growing the first semiconductor layer 120. The term 'mask for growing the first semiconductor layer 120' means that the first carbon nanotube layer 110 can be used to shelter part of the epitaxial growth surface 101 and expose the other part of the epitaxial growth surface 101. Thus, the first semiconductor layer 120 can grow from the exposed epitaxial growth surface 101. The first carbon nanotube layer 110 can form a pattern mask on the epitaxial growth surface 101 because the first carbon nanotube layer 110 defines a plurality of first apertures 112. Compare to lithography or etching, the method of forming a first carbon nanotube layer 110 as a mask is simple, low cost, and will not pollute the substrate 100.

In step (S13), the first semiconductor layer 120, the active layer 130 and the second semiconductor layer 140 can be grown respectively via a process of molecular beam epitaxy (MBE), chemical beam epitaxy (CBE), vacuum epitaxy, low temperature epitaxy, selective epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD). In one embodiment, the material of the first semiconductor layer 120, the active layer 130, and the second semiconductor layer 140 are the same semiconductor material, thus the defects caused by dislocation during the growth process will be reduced.

The first semiconductor layer 120 has a thickness of about 0.5 nm to about 5 μm, for example 10 nm, 100 nm, 1 μm, 2 μm, and 3 μm. In one embodiment, the thickness of the first semiconductor layer 120 is about 2 μm. The first semiconductor layer 120 is N-type semiconductor or P-type semiconductor. The material of N-type semiconductor can include N-type gallium nitride, N-type gallium arsenide, or N-type copper phosphate. The material of P-type semiconductor can include P-type gallium nitride, P-type gallium arsenide, or P-type copper phosphate. The N-type semiconductor is configured to provide electrons, and the P-type semiconductor is configured to provide holes. In one embodiment, the first semiconductor layer 120 is an N-type gallium nitride doped with Si.

In one embodiment, the first semiconductor layer 120 is made by a MOCVD method, and the growth of the first semiconductor layer 120 is a heteroepitaxial growth. In the MOCVD method, the nitrogen source gas is high-purity ammonia ($NH_3$), the carrier gas is hydrogen ($H_2$), the Ga source gas is trimethyl gallium (TMGa) or triethyl gallium (TEGa), and the Si source gas is silane ($SiH_4$). The growth of the first semiconductor layer 120 includes following steps:

(S131) placing the substrate 100 with the first carbon nanotube layer 110 thereon into a reaction chamber and heating the substrate 100 to about 1100° C. to about 1200° C., introducing the carrier gas, and baking the substrate 100 for about 200 seconds to about 1000 seconds;

(S132) growing the low-temperature GaN layer by reducing the temperature to a range from about 500° C. to 650° C. in the carrier gas atmosphere, and introducing the Ga source gas and the nitrogen source gas at the same time;

(S133) stop the flow of the Ga source gas in the carrier gas and nitrogen source gas atmosphere, increasing the temperature to a range from about 1100° C. to about 1200° C. and maintaining the temperature for about 30 seconds to about 300 seconds;

(S134) growing the high quality first semiconductor layer 120 by maintaining the temperature of the substrate 100 in a range from about 1000° C. to about 1100° C., and reintroducing the Ga source gas again and the Si source gas.

In step (S132), the low-temperature GaN is used as a buffer layer (not shown) to grow the first semiconductor layer 120. The thickness of the buffer layer is less than the thickness of the first carbon nanotube layer 110. Because the first semiconductor layer 120 and the substrate 100 has different lattice constants, the buffer layer is used to reduce the lattice mismatch during the growth process, thus the dislocation density of the first semiconductor layer 120 will be reduced.

In step (S134), the growth of the first semiconductor layer 120 includes three stages. In the first stage, a plurality of epitaxial crystal nucleus forms on the epitaxial growth surface 101, and the epitaxial crystal nucleus grows to a plurality of epitaxial crystal grains along the direction perpendicular to the epitaxial growth surface 101. In the second stage, the plurality of epitaxial crystal grains grow to a continuous epitaxial film along the direction parallel to the epitaxial growth surface 101. In the third stage, the epitaxial film continuously grow along the direction perpendicular to the epitaxial growth surface 101 to form a high quality epitaxial film. The epitaxial growth grains, epitaxial film, and the high-quality epitaxial film constitute the first semiconductor layer 120.

In the first stage, because the first carbon nanotube layer 110 is placed on the epitaxial growth surface 101, the epitaxial crystal grains are only grown from the exposed epitaxial growth surface 101 through the apertures 112. The process of epitaxial crystal grains growing along the direction substantially perpendicular to the epitaxial growth surface 101 is called vertical epitaxial growth.

In the second stage, the epitaxial crystal grains grow along the direction parallel to the epitaxial growth surface 101. The epitaxial crystal grains are gradually joined together to form the epitaxial film to cover the first carbon nanotube layer 110. During the growth process, the epitaxial crystal grains will grow around the carbon nanotubes, and then a plurality of grooves 122 will be formed in the first semiconductor layer 110 where the carbon nanotubes exist. The extending direction of the grooves 122 is parallel to the orientated direction of the carbon nanotubes. The carbon nanotubes are placed into the grooves 122 and enclosed by the first semiconductor layer 120 and the substrate 100, thus the carbon nanotubes will be semi-enclosed by the first semiconductor layer 120. An inner wall of the grooves 122 can be in contact with the carbon nanotubes or spaced from the carbon nanotubes, which depend on whether the material of the epitaxial film and the carbon nanotubes have mutual infiltration. Each groove 122 includes at least one carbon nanotubes. The carbon nanotubes in the grooves 122 are joined by van der Waals force to form the first carbon nanotube layer 110. The shape of the grooves 122 is arbitrary which related to the patterned first carbon nanotube layer 110. The maximum width of the grooves 122 ranges from about 20 nm to about 200 nm. The maximum width is the maximum size along the direction perpendicular to the extending direction of the grooves 122. In one embodiment, the maximum width of the grooves 122 ranges from about 50 nm to about 100 nm. The plurality of grooves 122 forms a patterned surface on the first semiconductor layer 120. The patterned surface of the first semiconductor layer 120 is similar to the first carbon nanotube layer 110.

The first carbon nanotube layer 110 includes a carbon nanotube film or a plurality of intersected carbon nanotube wires, and the plurality of grooves 122 are interconnected with each other to form a continuous network structure. The carbon nanotubes are also interconnected with each other to form a conductive structure. While the first carbon nanotube layer 110 includes a plurality of carbon nanotube wires parallel to each other, the plurality of grooves 122 will be parallel to each other. The grooves 122 are aligned with a certain interval, the distance between the two adjacent grooves 122 is substantially equal to the distance between the two adjacent carbon nanotube wires.

Figure 7:
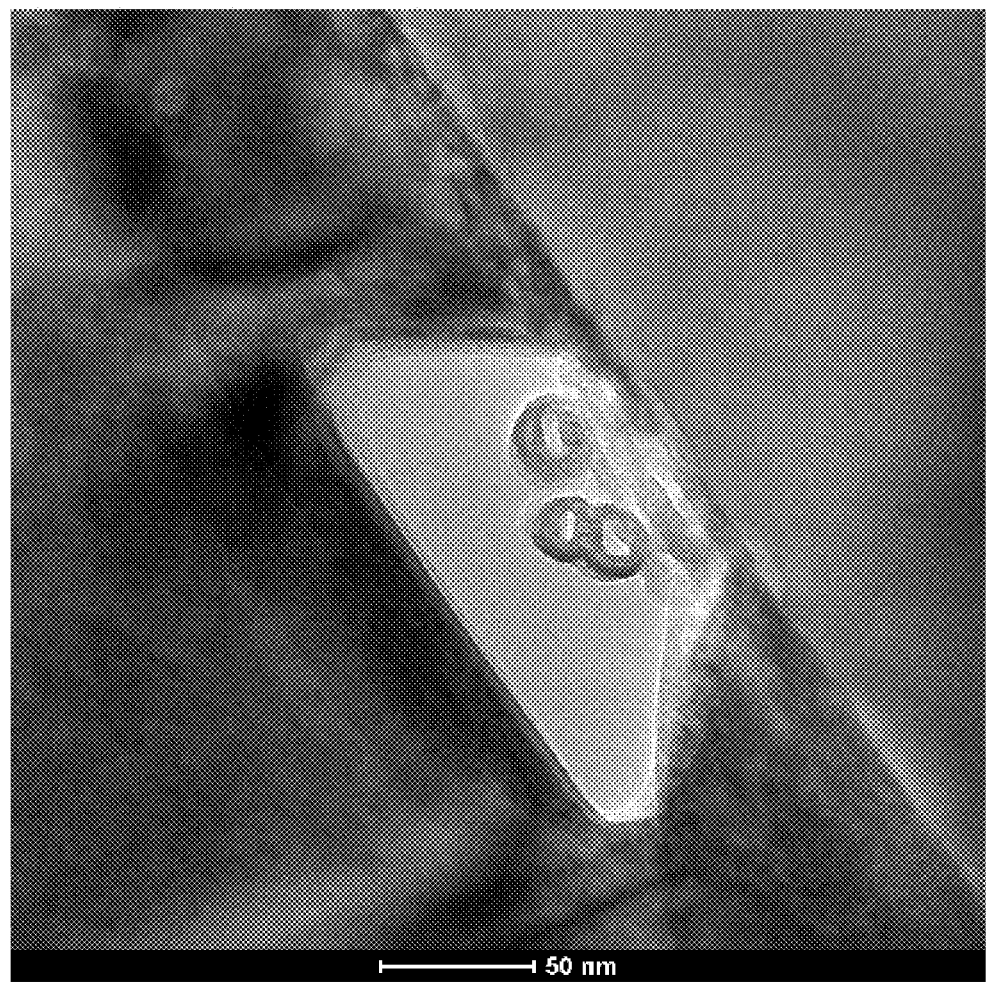
FIG. 7 shows a transmission electron microscopy (TEM) of a cross section of a junction between the first semiconductor layer and the substrate.

Also referring to FIG. 7, a cross section of a junction between the first semiconductor layer 120 and the substrate 100 is shown. The dark-colored layer is the first semiconductor layer 120, and the light-colored layer is the substrate 100. The grooves 122 exist on the face of the first semiconductor layer 120. The carbon nanotubes are semi-enclosed by the grooves 122 and attached on the surface of the substrate 100. In one embodiment, the carbon nanotubes are spaced from the first semiconductor layer 120.

The active layer 130 is deposited on the first semiconductor layer 120. The thickness of the active layer 130 range from about 0.01 µm to about 0.06 µm. The active layer 130 is a photon excitation layer and can be one of a single layer quantum well film or multilayer quantum well films. The active layer 130 is made of GaInN, AlGaInN, GaSn, AlGaSn, GaInP, or GaInSn. In one embodiment, the active layer 130 has a thickness of about 0.3 µm and includes one layer of GaInN and another layer of GaN. The GaInN layer is stacked with the GaN layer. The growth method of the active layer 130 is similar to the first semiconductor layer 120. In one embodiment, the indium source gas is trimethyl indium. The growth of the active layer 130 after the growth of the first semiconductor layer 120 includes the following steps:

(a1) stopping the flow of the Si source gas and maintaining the temperature of the reaction reaction chamber to a range from about 700° C. to about 900° C., the pressure of the reaction reaction chamber range from about 50 torrs to about 500 torrs; and (a2) introducing the indium source gas and growing InGaN/GaN multilayer quantum well film to form the active layer 130.

The thickness of the second semiconductor layer 140 range from about 0.1 µm to about 3 µm. The second semiconductor layer 140 can be an N-type semiconductor layer or a P-type semiconductor layer. Furthermore, the type of the second semiconductor layer 140 is different from the type of the first semiconductor layer 120. A surface of the second semiconductor layer 140 is used as an extraction surface of the LEDs. In one embodiment the second semiconductor layer 140 is a P-type gallium nitride doped with Mg. The thickness of the second semiconductor layer 140 is about 0.3 µm. The growth of the second semiconductor layer 140 is similar to the first semiconductor layer 120. The second semiconductor 140 is grown after the growth of the active layer 130. In one embodiment, the Mg source gas is ferrocene magnesium ($Cp_2Mg$), and the method includes the following steps:

(b1) 1 the flow of the indium source gas and maintaining the temperature of the reaction chamber in a range from about 1000° C. to about 1100° C., and maintaining the pressure of the reaction chamber in a range from about 76 torrs to about 200 torrs; and (b2) introducing the Mg source gas and growing P-type gallium nitride doped with Mg to form the second semiconductor layer 140.

In the step (S14), the reflector 150 is placed on the surface of the second semiconductor layer 140. The reflector 150 can be placed on the second semiconductor layer 140 via a method of physical vapor deposition, such as electron beam evaporation, vacuum evaporation, ion sputtering, physical deposition. The material of the reflector 150 can be selected from titanium (Ti), silver (Ag), aluminum (Al), nickel (Ni), gold (Au) or any combination thereof. The reflector 150 includes a smooth surface having a high reflectivity. The reflector 150 has a high conductivity for electrical contact with the second semiconductor layer 140. In one embodiment, the reflector 150 is a composite structure composed of Ni/Cu/Al. The Al layer is contacting the second semiconductor layer 140. The shape of the reflector 150 is arbitrary. In one embodiment, the reflector 150 covers a whole surface of the second semiconductor layer away from the active layer 130, thus the reflectivity can be improved. The electrons extracted from the active layer 130 reach the reflector 150 and are reflected. Transmitting electrons are transmitted away from the reflector 150.

The thickness of the reflector 150 can be selected according to need. In one embodiment, the reflector 150 is composed of Ni/Cu/Al and has a thickness in the range from about 50 nm to about 250 nm. The Ni layer has a thickness in the range from about 10 nm to about 50 nm, the Cu layer has a thickness in the range from about 10 nm to about 50 nm, and the Al layer has a thickness in the range from about 30 nm to about 150 nm. In one embodiment, the thickness of Ni layer is about 20 nm, the thickness of the Cu layer is about 20 nm, and the thickness of the Al is about 100 nm.

The first electrode 160 is placed on the surface of the reflector 150. The shape of the first electrode 160 is arbitrary and can be selected according to need. In one embodiment, the first electrode 160 covers a whole surface of the reflector 150, thus the current density and the current diffusion rate can be improved. The first electrode 160 can also be used as the heat sink at the same time to conduct the heat out of the LED. The first electrode 160 is a single layer structure or a multi-layer structure. The material of the first electrode 160 can be selected from Ti, Ag, Al, Ni, Au, or any combination of them. The material of the first electrode 160 can also be indium-tin oxide (ITO) or carbon nanotube film. In one embodiment, the first electrode 160 is a two-layer structure consisted of a Ti layer with about 15 nm in thickness and an Au layer with about 100 nm in thickness. Furthermore, the reflector 150 and the first electrode 160 can be an integrated structure. The reflector 150 can also be used as the first electrode 160 or the first electrode 160 can also be used to reflect the electrons. If the first electrode 160 is transparent, the fabrication order can be exchanged so the first electrode 160 is placed between the reflector 150 and the second semiconductor layer 140.

In step (S15), the substrate 100 can be removed by laser irradiation, etching, or thermal expansion and contraction. The removal method can be selected according to the material of the substrate 100 and the first semiconductor layer 120. In one embodiment, the substrate 100 is removed by laser irradiation. The substrate 100 can be removed from the first semiconductor layer 120 by the following steps:

(S151) polishing and cleaning the surface of the substrate 100 away from the first semiconductor layer 120;

(S152) placing the substrate 100 on a platform (not shown) and irradiating the substrate 100 and the first semiconductor layer 120 with a laser; and (S153) immersing the substrate 100 into a solvent and removing the substrate 100.

In step (S151), the substrate 100 can be polished by a mechanical polishing method or a chemical polishing method to obtain a smooth surface. Thus the scatting of the laser will be reduced. The substrate 100 can be cleaned with hydrochloric acid or sulfuric acid to remove the metallic impurities and oil.

In step (S152), the substrate 100 is irradiated by the laser from the polished surface, and the incidence angle of the laser is perpendicular to the surface of the substrate 100. The wavelength of the laser is selected according to the material of the first semiconductor layer 120 and the substrate 100. The energy of the laser is smaller than the bandgap energy of the substrate 100 and larger than the bandgap energy of the first semiconductor layer 120. Thus the laser can pass through the substrate 100 and reach the interface between the substrate 100 and the first semiconductor layer 120. The buffer layer 1202 at the interface has a strong absorption of the laser, and the temperature of the buffer layer 1202 will be raised rapidly. Thus the buffer layer 1202 will be decomposed. In one embodiment, the bandgap energy of the first semiconductor layer 120 is about 3.3 ev, and the bandgap energy of the substrate 100 is about 9.9 ev. The laser is a KrF laser, the wavelength of the laser is about 248 nm, the energy is about 5ev, the pulse width range is about 20 nanoseconds to about 40 nanoseconds, the energy density ranges from about 400 mJ/cm$^2$ to about 600 mJ/cm$^2$, and the shape of the laser pattern is square with a size of 0.5 mm×0.5 mm. The laser moves from one edge of the substrate 100 with a speed of 0.5 mm/s During the irradiating process, the GaN is decomposed to Ga and N$_2$. It is understood that the parameter of the laser can be adjusted according to need. The wavelength of the laser can be selected according to the absorption of the buffer layer 1202.

Because the buffer layer 1202 has a strong absorption of the laser, the buffer layer 1202 can be decomposed rapidly. However, the first semiconductor layer 120 has a weak absorption, so it does not decompose quickly. The irradiating process can be performed in a vacuum or a protective gas environment to prevent the oxidation of the carbon nanotubes. The protective gas can be nitrogen, helium, argon or other inert gas.

In step (S153), the substrate 100 can be immersed into an acidic solution to remove the Ga decomposed from GaN so that the substrate 100 can be peeled off from the first semiconductor layer 120. In one embodiment, the first carbon nanotube layer 110 is directly attached on the epitaxial growth surface 101 of the substrate 100, so the carbon nanotubes can be peeled off with the substrate 100 together. During the peeling process, the shape and the distribution of the grooves are not changed.

In the thermal expansion and contraction method, the substrate 100 is heated to a temperature above 1000° C. and cooled to a temperature below 1000° C. within a short period of time, such as from 2 minutes to about 20 minutes. The substrate 100 separates from the first semiconductor layer 110 by cracking because of the thermal expansion mismatch between the substrate 100 and the first semiconductor layer 110.

In step (S16), the second electrode 170 is placed on the first semiconductor layer 120 via a process of physical vapor deposition, such as electron beam evaporation, vacuum evaporation, ion sputtering, physical deposition, or the like. Furthermore, the second electrode 170 can be formed by applied a conductive plate on the first semiconductor layer 120 via a conductive adhesive. The second electrode 170 electrically contacts the first semiconductor layer 120 and disposed on the light extraction surface of the LED 10. The second electrode 170 is placed via a process of physical vapor deposition, and forms a continuous layer-structure. Because the first semiconductor layer 120 includes a plurality of grooves 122, a portion of the second electrode 170 will be deposited into the grooves 122. Furthermore, the second electrode 170 can be a transparent substrate or a carbon nanotube film. The second electrode 170 can cover some of the grooves 122. In one embodiment, the second electrode 170 covers all the grooves 122, thus the current diffusion speed will be improved and the heat produced in the LED will be reduced. The second electrode 170 can be an N-type electrode or P-type electrode. The type of the second electrode 170 is same as the first semiconductor layer 120. The second electrode 170 is a single layer structure or a multi-layer structure. The material of the second electrode 170 can be selected from Ti, Ag, Al, Ni, Au or any combination of them. The material of the second electrode 170 can also be ITO. In one embodiment, the second electrode 170 is transparent to reduce the reflectivity and the absorption, thus improving the light extraction efficiency.

The method for making the LED 10 has many advantages. First, the carbon nanotube layer is a free-standing structure, thus it can be directly placed on the surface of the substrate and the complex sputtering and etching process is not required. Second, due to the existence of the carbon nanotubes, the plurality of grooves are formed in the LED, thus the complex etching method can be avoided and the damage to the lattice structure of the LED is reduced. Third, because the diameter of the carbon nanotubes and the width of the grooves are so small, the extraction efficiency of the LED will be improved. Fourth, the carbon nanotube layer is a patterned structure and thickness and the size of the spaces are small, so when the carbon nanotube layer is used to grow the epitaxial layer, the epitaxial grains will have a smaller size, the dislocation will be reduced and the quality of the semiconductor layer will be improved.

Figure 8:
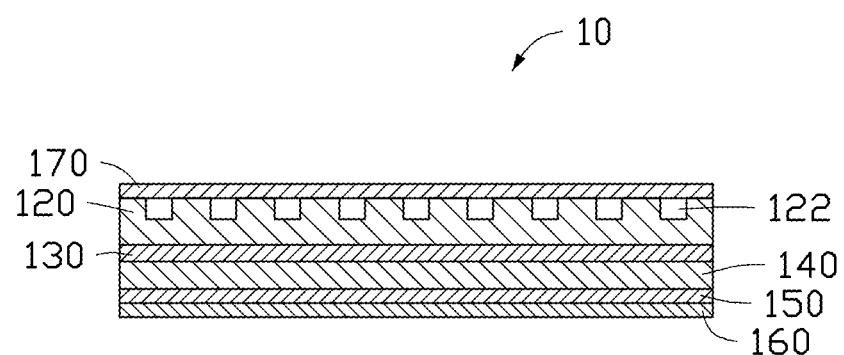
FIG. 8 shows a schematic view of one embodiment of a LED fabricated according to the method of FIG. 1.

Referring to FIG. 8, an LED 10 includes a first semiconductor layer 120, an active layer 130, a second semiconductor layer 140, a reflector 150, a first electrode 160, and a second electrode 170. The reflector 150, the first semiconductor layer 120, the active layer 130, the second semiconductor layer 140, and the second electrode 170 are stacked on a surface of the first electrode 160 in that order. The reflector 150 is contacting the first electrode 160. A surface of the first semiconductor layer 120 defines a plurality of grooves 122 to form a patterned surface. The second electrode 170 is placed on the patterned surface which is used as the light extraction surface. The width of the grooves 122 range from about 50 nm to about 100 nm.

The second electrode 170 can be an N-type electrode or P-type electrode. The type of the second electrode 170 is the same as the first semiconductor layer 120. The second electrode 170 can be a single layer structure or a multi-layer structure. The material of the second electrode 170 can be selected from Ti, Ag, Al, Ni, Au, or any combination of them. In one embodiment, the second electrode 170 is a two-layer structure consisting of a Ti layer with a thickness of about 15 nm and an Au layer with a thickness of about 200 nm. The Au layer is attached on the first semiconductor layer 120. The patterned surface of the first semiconductor layer 120 can be partly covered by the second electrode 170. In one embodiment, the whole patterned surface of the first semiconductor layer 120 is covered by the second electrode 170, thus the current diffusion speed will be improved and the heat produced in the LED will be reduced.

The light extraction surface of the LED 10 includes a plurality of grooves 122. As the photons reach the light extraction surface with a large incident angle, the grooves 122 change the motion direction of the photons, so that these photons can be extracted from the light emitting surface. The light extraction efficiency of the LED 10 will be improved.

Figure 9:
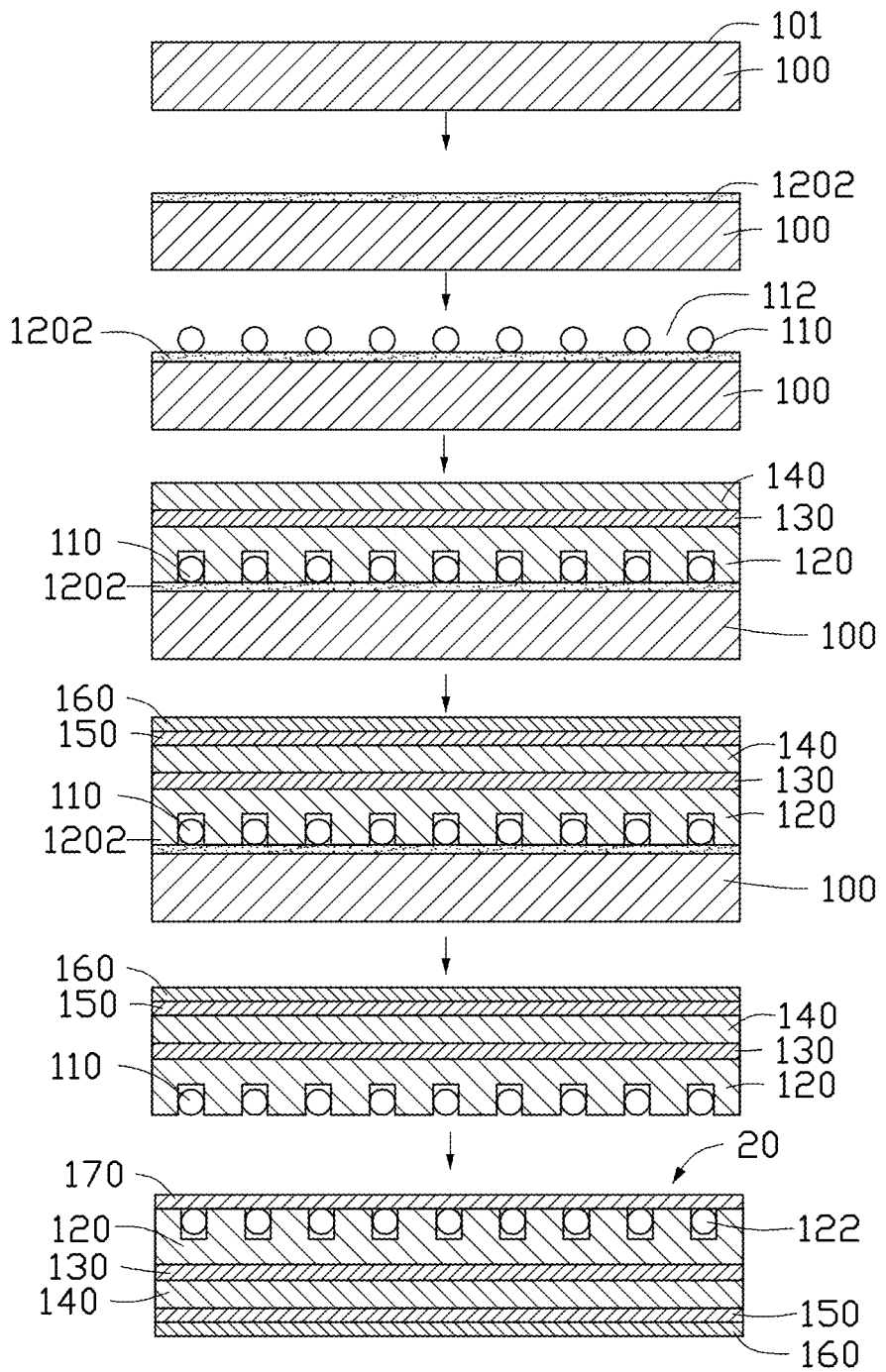
FIG. 9 is a flowchart of one embodiment of a method for making a LED.

Referring to FIG. 9, a method for making an LED 20 includes the following steps:
(S21) providing a substrate 100 having an epitaxial growth surface 101;
(S22) growing a buffer layer 1202 on the epitaxial growth surface 101;
(S23) placing a carbon nanotube layer 110 on the buffer layer 1202;
(S24) growing a first semiconductor layer 120, an active layer 130, and a second semiconductor layer 140 in that order on the buffer layer 1202 and the carbon nanotube layer 110;
(S25) applying a reflector 150 and a first electrode 160 in that order on a surface of the second semiconductor layer 140;
(S26) removing the substrate 100 and exposing the carbon nanotube layer 110; and
(S27) applying a second electrode 170 on a surface of the carbon nanotube layer 110.

The method for making the LED 20 is similar to the method for making the LED 10, except that the buffer layer 1202 grows on the substrate 100 before placing the carbon nanotube layer 110. As the substrate 100 is removed, the carbon nanotube layer 110 will be exposed.

In step (S22), the method of growing the buffer layer 1202 is similar to the first semiconductor layer 110. The material of the buffer layer 1202 is selected from Si, GaAs, GaN, GaSb, InN, InP, InAs, InSb, AlP, AlAs, AlSb, AN, GaP, SiC, SiGe, GaMnAs, GaAlAs, GaInAs, GaAlN, GaInN, AlInN, GaAsP, InGaN, AlGaInN, AlGaInP, GaP:Zn or GaP:N according to the first semiconductor layer 110. In one embodiment, the buffer layer 1202 is a low-temperature GaN used to reduce the dislocation of the first semiconductor layer 120.

In one embodiment, the buffer layer 1202 is fabricated by the MOCVD method. The nitrogen source gas is high-purity $NH_3$, the carrier gas is $H_2$, and the Ga source gas is TEGa or TEGa. The growth of the buffer layer 1202 includes the following steps:
(S221) placing the substrate 100 into a furnace and heating the substrate 100 to about 1100° C. to about 1200° C., introducing the carrier gas and baking the substrate 100 for about 200 seconds to about 1000 seconds;
(S222) cooling down the temperature to a range from about 500° C. to about 650° C. in the carrier gas atmosphere, introducing the Ga source gas and the nitrogen source gas at the same time to grow low-temperature GaN layer.

In step (S23), the carbon nanotube layer 110 is placed on the buffer layer 1202. The carbon nanotubes are electrically contacting the buffer layer 1202. While the carbon nanotube layer 110 is placed on the buffer layer 1202, the plurality of carbon nanotubes are aligned parallel to the surface of the buffer layer 1202. The carbon nanotube layer 110 includes a plurality of apertures 112, and the buffer layer 1202 is exposed from the carbon nanotube layer 110 through the apertures 112.

In step (S24), the Ga source gas is TMGa or TEGa, the Si source gas is $SiH_4$. The method of growing the first semiconductor layer 120 includes three stages. In the first stage, a plurality of epitaxial crystal nucleus forms on the buffer layer 1202, and the epitaxial crystal nucleus grows a plurality of epitaxial crystal grains along a direction perpendicular to the buffer layer 1202. In the second stage, the plurality of epitaxial crystal grains grow to a continuous epitaxial film along the direction parallel to the surface of buffer layer 1202. In the third stage, making the epitaxial film continuously grow along the direction perpendicular to the surface of the buffer layer 1202 to form the first semiconductor layer 120.

In the second stage, during the growth process, the epitaxial crystal grains will grow around the carbon nanotubes, and a plurality of grooves 122 will be formed in the first semiconductor layer 110 where the carbon nanotubes exist. The carbon nanotubes are placed into the grooves 122 and enclosed by the first semiconductor layer 120 and the buffer layer 1202, thus the carbon nanotubes will be semi-enclosed by the first semiconductor layer 120. The surface of the carbon nanotubes will be partly attached on the inner surface of the grooves 122. The plurality of grooves 122 forms a patterned surface of the first semiconductor layer 120. The patterned surface of the first semiconductor layer 120 is similar to the carbon nanotube layer 110.

In step (S26), the substrate 100 can be removed by the method mentioned above. However, because the buffer layer 1202 is sandwiched between the carbon nanotube layer 110 and the substrate 100, the carbon nanotubes cannot be directly attached on the surface of the substrate 100 and peeled of with the substrate 100. Furthermore, while the buffer layer 1202 is irradiated by the laser, the buffer layer 1202 will be decomposed, and the buffer layer 1202 will be dissolved in the solution, thus the carbon nanotube layer 110 can be detached from the buffer layer 1202. The carbon nanotubes will be preserved in the grooves 122. Due to the buffer layer 1202, damage to the grooves 122 will be reduced during the peeling process. The carbon nanotubes can also diminished the contact surface between the buffer layer 1202 and the first semiconductor layer 120, thus the stress will be reduced.

In step (S27), the second electrode 170 is placed on the first semiconductor layer 120 via a process of physical vapor deposition. The second electrode 170 is placed on the light extraction surface of the LED 20. The second electrode 170 can cover a portion of the light extraction surface. In one embodiment, the second electrode 170 covers the entire light extraction surface, thus the current diffusion speed will be improved and the heat produced in the LED will be reduced.

Furthermore, the second electrode 170 is in electrical contact with the carbon nanotube layer 110. The carbon nanotube layer 110 includes a carbon nanotube film. The second electrode 170 is electrically contacting a portion of the carbon nanotube film. If the carbon nanotube layer 110 includes a plurality of carbon nanotube wires parallel with each other, the second electrode 170 is electrically contacting each carbon nanotube wire. If the carbon nanotube layer 110 includes a plurality of carbon nanotube wires intersecting each other, the second electrode 170 is electrically contacting at least one of the carbon nanotube wire.

Figure 10:
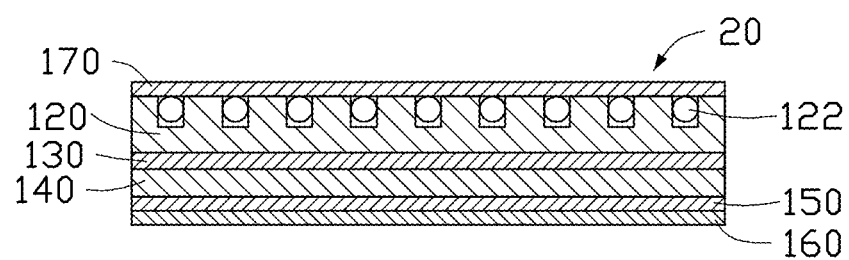
FIG. 10 shows a schematic view of one embodiment of a LED fabricated according to the method of FIG. 9.

Referring to FIG. 10, an LED 20 includes a carbon nanotube layer 110, a first semiconductor layer 120, an active layer 130, a second semiconductor layer 140, a reflector 150, a first electrode 160, and a second electrode 170. The reflector 150, the second semiconductor layer 140, the active layer 130, the first semiconductor layer 120, the carbon nanotube layer 110, and the second electrode 170 are stacked on a surface of the first electrode 160 in that order. The reflector 150 is contacting the first electrode 160. A surface of the first semiconductor layer 120 includes a plurality of grooves 122 to form a patterned surface. The carbon nanotubes of the carbon nanotube layer 110 are embedded in the grooves 122. The second electrode 170 is placed on the patterned surface used as the light extraction surface. The second electrode 170 is electrically contacting the carbon nanotube layer 110 and the first semiconductor layer 120.

Each groove 122 includes a carbon nanotube bundle consisting of at least one carbon nanotube. The carbon nanotubes in the grooves are joined by van der Waals force to form the carbon nanotube layer 110. The surface of the carbon nanotubes will be partly attached on the inner surface of the grooves 122. Because the carbon nanotubes have a specific surface, the carbon nanotubes will be fixed in the grooves 122.

In one embodiment, the carbon nanotube layer 110 is a carbon nanotube film. The carbon nanotube film includes a plurality of carbon nanotubes oriented along a preferred orientation. In the orientation, the carbon nanotubes are joined end to end. In the direction perpendicular to the orientation, a plurality of gaps or micro-holes exists between some adjacent carbon nanotubes. The gaps or micro-holes form the apertures 112. The carbon nanotube layer 110 includes a plurality of apertures 112. The first semiconductor layer 120 is partly filled into the apertures 112.

Furthermore, the carbon nanotube layer 110 can also includes a plurality of carbon nanotube wires parallel with each other. Each of the carbon nanotube wires is fixed into a groove 122. The distance between two adjacent carbon nanotube wires range from a bout 0.1 μm to about 200 μm. In one embodiment, the distance ranges from about 10 μm to about 100 μm. The interval between the two adjacent carbon nanotube wires forms the apertures 112 of the carbon nanotube layer 110. The smaller the size of the apertures 112 is, the less dislocations will exist in the growth of the first semiconductor layer 120, and the quality of the semiconductor layer 120 will be improved.

In one embodiment, the carbon nanotube layer 110 can also include a plurality of carbon nanotube wires intersecting each other. Some carbon nanotube wires are set along a first direction, and some carbon nanotube wires are set along a second direction. The first direction intersects the second direction. In one embodiment, the first direction is substantially perpendicular with the second direction. Thus the surface of the first semiconductor layer 120 includes a plurality of grooves 122 intersecting each other.

In the LED 20, the carbon nanotube layer is a transparent and free-standing structure and has a large contact surface with the electrode, thus the area of the second electrode can be reduced, the current in the LED can be uniformly dispersed, and the second electrode area can be reduced. The heat produced by the LED can conduct out of the LED via the carbon nanotubes. Furthermore, the conduction current in the LED can be uniformly dispersed, thereby improving the light extraction efficiency.

Figure 11:
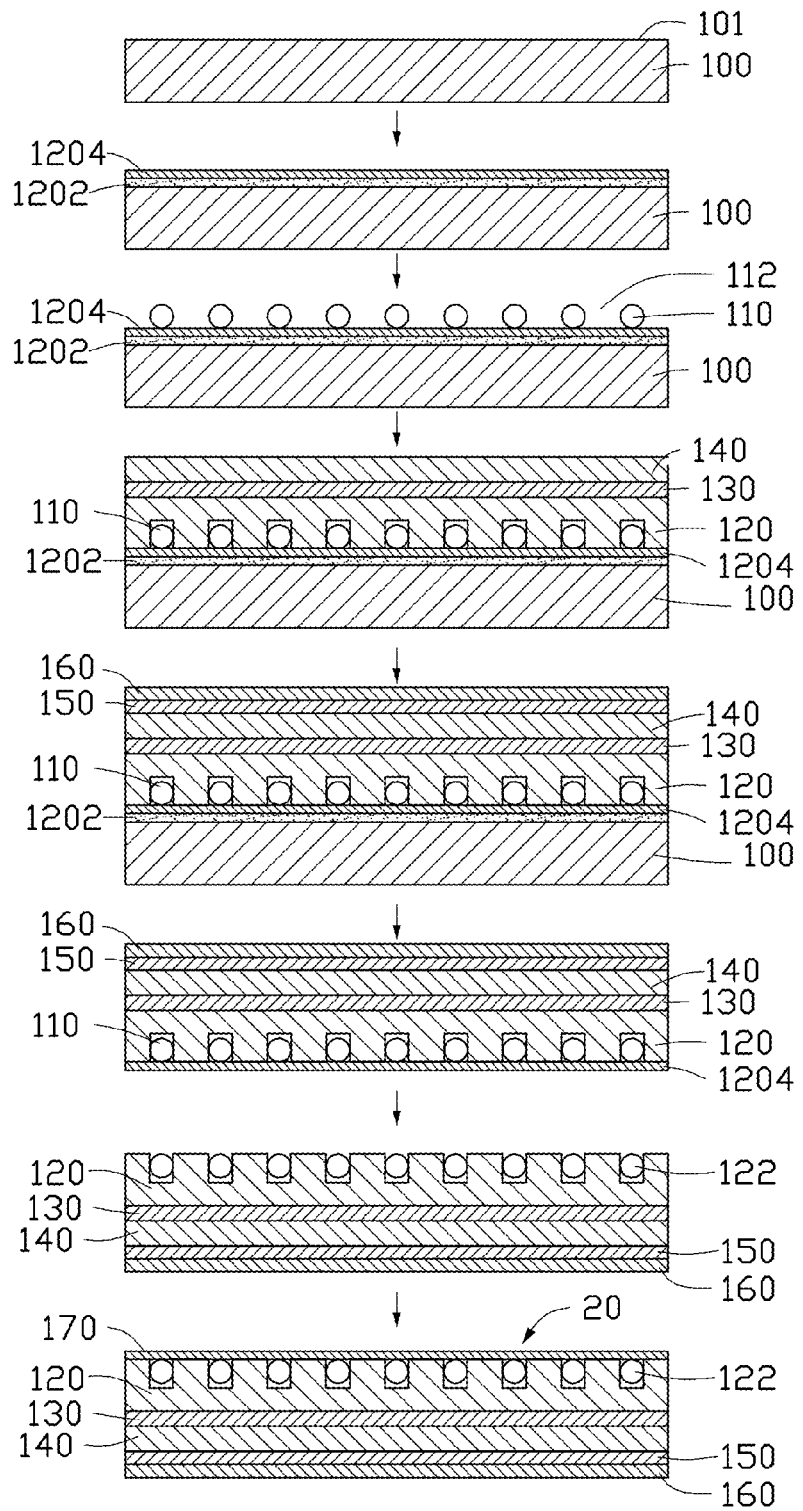
FIG. 11 shows a flowchart of one embodiment of a method for making a LED.

Referring to FIG. 11, a method for making the LED 20 includes the following steps:
(S31) providing a substrate 100 having an epitaxial growth surface 101;
(S32) growing a buffer layer 1202 and an intrinsic semiconductor layer 1204 in that order on the epitaxial growth surface 101;
(S33) placing a carbon nanotube layer 110 on the intrinsic semiconductor layer 1204;
(S34) growing a first semiconductor layer 120, an active layer 130, a second semiconductor layer 140 in that order on the intrinsic semiconductor layer 1204;
(S35) applying a reflector and a first electrode 160 on a surface of the second semiconductor layer 140;
(S36) removing the substrate 100 and the intrinsic semiconductor layer 1204 to expose the carbon nanotube layer 110; and
(S37) applying a second electrode 170 on a surface of the carbon nanotube layer 110.

In step (S32), the method of growing the intrinsic semiconductor layer 1204 on the buffer layer 1202 includes the following steps:
(S321) keeping the temperature of the furnace at a range from about 1000° C. to about 1100° C. and the pressure in a range from about 100 torr to about 300 torr;
(S322) introducing the Ga source gas and growing the intrinsic semiconductor layer 1204 on the buffer layer 1202.

In step (S322), the thickness of the intrinsic semiconductor layer 1204 range from about 10 nm to about 1 pm.

In step (S34), the surface of the intrinsic semiconductor layer 1204 is partly exposed through the apertures 112 of the carbon nanotube layer 110, and the epitaxial grains grow on the surface and pass through the apertures 112 to form the first semiconductor layer 120. The active layer 130 and the second semiconductor layer 140 grow on the surface of the intrinsic semiconductor layer 1204 in that order.

In step (S36), during the process of removing the substrate 100 with laser, the buffer layer 1202 is decomposed and dissolved in the acidic solution, thus the substrate 100 is peeled off. Furthermore, the intrinsic semiconductor layer 1204 can also be decomposed in the acidic solution at the same time, thus the carbon nanotube layer 110 will be exposed. Furthermore, the intrinsic semiconductor layer 1204 can be removed by ion etching or wet etching.

In step (S37), the intrinsic semiconductor layer 1204 can be etched by plasma etching or wet etching method. The intrinsic semiconductor layer 1204 can be partly removed, and a portion of the carbon nanotube layer 110 will be exposed. The intrinsic semiconductor layer 1204 can also be completely removed, thus the whole carbon nanotube layer 110 is exposed. In one embodiment, the intrinsic semiconductor layer 1204 is completely removed via plasma etching method in an inductively coupled plasma system. The etching atmosphere is composed of chlorine and silicon tetrachloride. The power of the inductively coupled plasma system is about 50 watts, the flow rate of the chlorine is about 26 sccm, the flow rate of the silicon tetrachloride is about 4 sccm, and the pressure of the atmosphere is about 2 Pascal.

Because the intrinsic semiconductor layer 1204 grows on the buffer layer 1202, thus the dislocations in the first semiconductor layer 120, the active layer 130 and the second semiconductor layer 140 will be reduced, and the quality of them will be improved. Though the light extraction efficiency of the LED 20 will be improved.

The method for making the LED has many advantages. First, the carbon nanotube layer is a continuous and free-standing structure, and it can be directly placed on the substrate to grow the epitaxial layer. The process is simple and the complex sputtering process is avoided. Second, a plurality of microstructures can be formed on the light extraction surface of LED by using carbon nanotube layers as the mask layer, thereby avoiding a complex etching process and reducing the possibility of damage to the lattice structure of the LED. Third, because the spaces in the carbon nanotube layer and the microstructures are small, the light extraction efficiency will be improved.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A method of making a light emitting diode, comprising:
   providing a substrate having an epitaxial growth surface;
   growing a buffer layer on the epitaxial growth surface;
   placing a carbon nanotube layer on the buffer layer;
   growing a first semiconductor layer, an active layer, and a second semiconductor layer in that order on the substrate, wherein the first semiconductor layer covers on the carbon nanotube layer;
   applying a reflector and a first electrode on a surface of the second semiconductor layer;
   removing the substrate and the buffer layer to expose the carbon nanotube layer; and
   applying a second electrode electrically connected with the carbon nanotube layer.

2. The method of claim 1, wherein the growing of the buffer layer comprises growing a low-temperature GaN on the substrate.

3. The method of claim 2, wherein the growing the low-temperature GaN is performed via a MOCVD and comprises following steps:
   placing the substrate into a furnace and heating the substrate to about 1100° C. to about 1200° C.;
   introducing a carrier gas and baking the substrate for about 200 seconds to about 1000 seconds; and
   cooling down the temperature to a range from about 500° C. to about 650° C. in the carrier gas atmosphere, introducing a Ga source gas and a nitrogen source gas at the same time to grow low-temperature GaN layer.

4. The method of claim 1, wherein the carbon nanotube layer is a continuous and free-standing structure, and the carbon nanotube layer is directly placed on the buffer layer.

5. The method of claim 1, wherein the carbon nanotube layer comprises a carbon nanotube film, and the carbon nanotube film comprises a plurality of carbon nanotubes oriented substantially along a same direction.

6. The method of claim 5, wherein the carbon nanotubes are oriented substantially parallel to the buffer layer.

7. The method of claim 5, wherein a plurality of apertures is defined by the carbon nanotube layer and a part of the buffer layer is exposed from the apertures.

8. The method of claim 7, wherein the first semiconductor layer is grown from the exposed epitaxial growth surface and through the apertures.

9. The method of claim 8, wherein a plurality of grooves is formed on a surface of the first semiconductor layer, and the plurality of carbon nanotubes are embedded in the plurality of grooves.

10. The method of claim 9, wherein the plurality of carbon nanotubes are enclosed by the first semiconductor layer and the buffer layer.

11. The method of claim 10, wherein surface of the carbon nanotubes is partly attached on an inner surface of the grooves.

12. The method of claim 1, wherein the substrate is removed by laser irradiation, etching, or temperature expansion and contraction.

13. The method of claim 12, wherein the buffer layer is removed during process of removing the substrate.

14. The method of claim 1, wherein the growth method of the buffer layer, the first semiconductor layer, the active layer, and the second semiconductor layer is selected from the group consisting of molecular beam epitaxy, chemical beam epitaxy, vacuum epitaxy, low temperature epitaxy, selective epitaxy, liquid phase deposition epitaxy, metal organic vapor phase epitaxy, ultra-high vacuum chemical vapor deposition, hydride vapor phase epitaxy, and metal organic chemical vapor deposition.

15. The method of claim 1, wherein the growing the buffer layer is performed via a heteroepitaxial growth method.

* * * * *